United States Patent [19]

Calderbank et al.

[11] Patent Number: 5,115,453
[45] Date of Patent: May 19, 1992

[54] TECHNIQUE FOR DESIGNING A MULTIDIMENSIONAL SIGNALING SCHEME

[75] Inventors: Arthur R. Calderbank, Maplewood, N.J.; Lawrence H. Ozarow, Schenectady, N.Y.

[73] Assignee: AT&T Bell Laboratories, Murray Hill, N.J.

[21] Appl. No.: 590,849

[22] Filed: Oct. 1, 1990

[51] Int. Cl.$^5$ .................... H04L 5/12; H03M 13/00
[52] U.S. Cl. ................... 375/39; 371/37.8; 371/43; 332/103
[58] Field of Search ............ 375/37, 38, 39; 371/37.8, 43; 332/103

[56] References Cited

U.S. PATENT DOCUMENTS

| | | | |
|---|---|---|---|
| 4,084,137 | 4/1978 | Welti | 375/38 |
| 4,507,648 | 3/1985 | Conway et al. | 375/38 |
| 4,562,426 | 12/1985 | Forney, Jr. | 375/39 |
| 4,713,817 | 12/1987 | Wei | 375/39 |
| 4,721,928 | 1/1988 | Yoshida | 375/39 |
| 4,855,692 | 8/1989 | Kennard et al. | 375/39 |
| 4,873,701 | 10/1989 | Tretter | 375/39 |

Primary Examiner—Benedict V. Safourek
Assistant Examiner—Young Tse
Attorney, Agent, or Firm—Ronald D. Slusky; David R. Padnes

[57] ABSTRACT

In a system where a signal constellation is used for data communications, signal points in the signal constellation are selected to represent incoming data. The signal points, thus selected, are transmitted through a channel. The signal constellation is divided into a plurality of regions each including an equal number of signal points. A coding scheme is employed to ensure that signal points within any one region are selected equiprobably, and the probability of selecting any signal point in one region is different from that in another region.

34 Claims, 3 Drawing Sheets

FIG. 2

| I \ Q | -15 | -13 | -11 | -9 | -7 | -5 | -3 | -1 | 1 | 3 | 5 | 7 | 9 | 11 | 13 | 15 |
|---|---|---|---|---|---|---|---|---|---|---|---|---|---|---|---|---|
| 15 | | | | | | b5 | b2 | ad | ba | | | | | | | |
| 13 | | | | | a4 | 97 | 8c | 8b | 84 | 93 | 98 | ad | | | | |
| 11 | | | bd | 9e | 79 | 72 | 69 | 66 | 61 | 6e | 75 | 7e | a1 | be | | |
| 9 | | | a0 | 83 | 5c | 57 | 4c | 47 | 40 | 4b | 50 | 5b | 80 | 9f | | |
| 7 | | aa | 7d | 5a | 3d | 3a | 31 | 2a | 21 | 2e | 35 | 3e | 5d | 7a | a5 | |
| 5 | | 9b | 74 | 53 | 34 | 27 | 1c | 17 | 10 | 1b | 24 | 3b | 54 | 73 | 94 | |
| 3 | b9 | 92 | 6d | 4a | 2d | 1a | B0d | C0a | B05 | C0e | 1e | 32 | 4d | 6a | 8d | b6 |
| 1 | ac | 87 | 60 | 43 | 20 | 13 | D04 | A03 | D00 | A0b | 14 | 2b | 44 | 67 | 88 | b3 |
| -1 | b1 | 8a | 65 | 46 | 29 | 16 | B09 | C02 | B01 | C06 | 11 | 22 | 41 | 62 | 85 | ae |
| -3 | b4 | 8f | 68 | 4f | 30 | 1f | D0c | A07 | D08 | A0f | 18 | 2f | 48 | 6f | 90 | bb |
| -5 | | 96 | 71 | 56 | 39 | 26 | 19 | 12 | 15 | 1e | 25 | 36 | 51 | 76 | 99 | |
| -7 | | a7 | 78 | 5f | 3c | 37 | 2c | 23 | 28 | 33 | 38 | 3f | 58 | 7f | a8 | |
| -9 | | | 9d | 82 | 59 | 52 | 49 | 42 | 45 | 4e | 55 | 5e | 81 | a2 | | |
| -11 | | | bc | a3 | 7c | 77 | 6c | 63 | 64 | 6b | 70 | 7b | 9c | bf | | |
| -13 | | | | | a9 | 9a | 91 | 86 | 89 | 8e | 95 | a6 | | | | |
| -15 | | | | | | b8 | af | b0 | b7 | | | | | | | |

ENCLOSES $R_1$'s

ENCLOSES $R_2$'s

ENCLOSES $R_3$'s

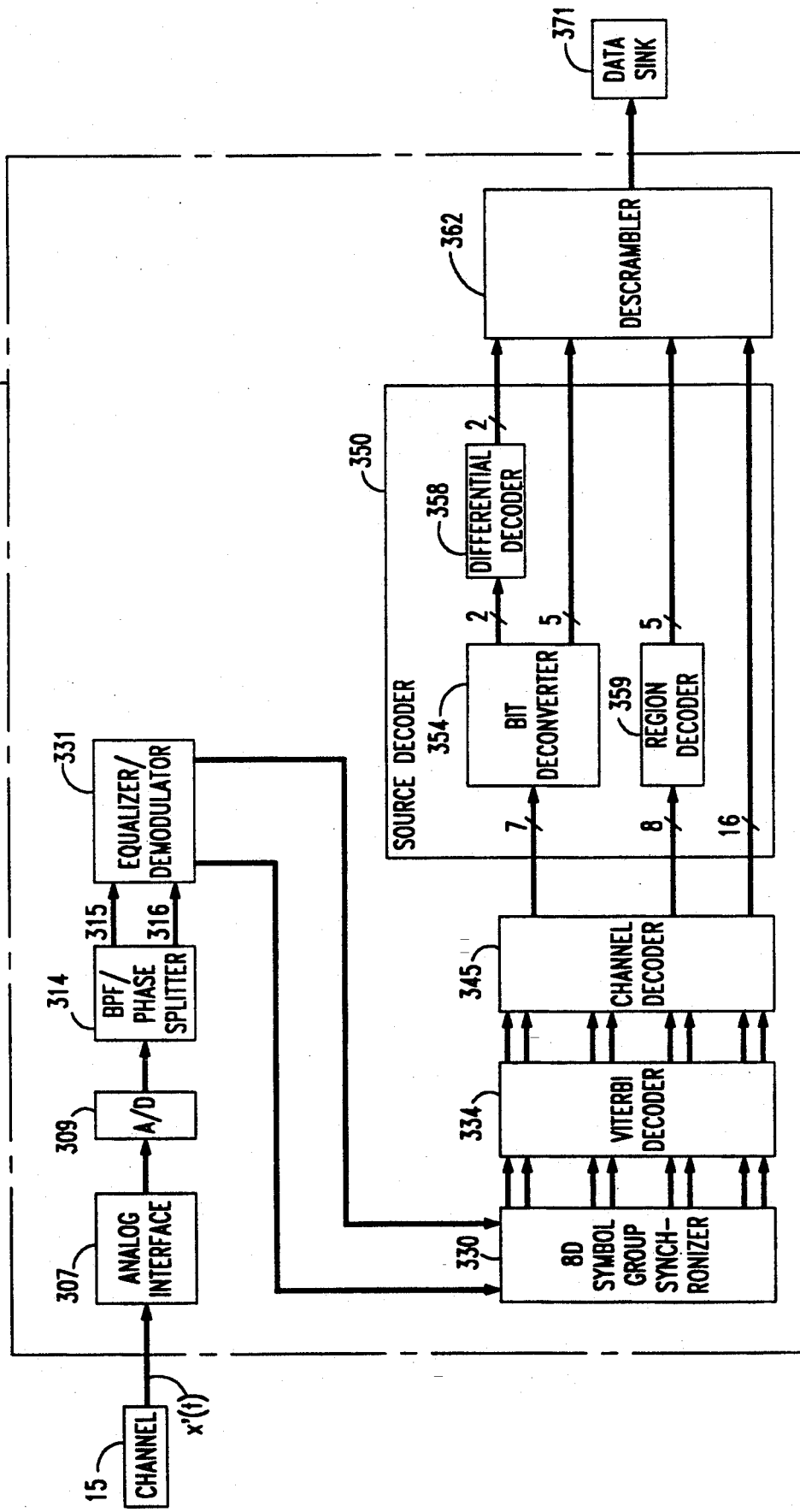

TECHNIQUE FOR DESIGNING A MULTIDIMENSIONAL SIGNALING SCHEME

TECHNICAL FIELD

The present invention relates to a communication system which utilizes a multidimensional signaling scheme.

BACKGROUND OF THE INVENTION

A data communications system oftentimes employs a multidimensional signaling scheme. Examples of multidimensional signaling systems are shown in U.S. Pat. No. 4,084,137 issued Apr. 11, 1978 to G. R. Welti, which is hereby incorporated by reference. In such a system, each possible value of an input word, which includes a plurality of data bits, is assigned to a multidimensional signal point. Such a signal point is drawn from a signal constellation, whose desirability is in part measured by a peak-to-average-power ratio (PAR). Specifically, PAR is defined as the ratio of the maximum signal power to the average signal power, needed to transmit a signal point of the constellation. As is well-known, the susceptibility of the constellation to nonlinear distortions and perturbations incurred in a channel varies directly with the PAR. Thus, a constellation having a low PAR is desirable in that its signal points are more likely to be accurately recovered despite the presence of the nonlinear distortions and perturbations which adversely affect the signal point transmission.

The signal points of a signal constellation in a multidimensional signaling scheme are uniformly distributed within an enclosed domain in an N-dimensional space, where $N \geq 2$. It is well-known that the shape of this enclosed domain affects the average signal power. Thus, it is desirable to shape the constellation in such a manner that the average signal power is minimized so as to conserve the transmission power. The term "shape gain" refers to the decrease in the average signal power by virtue of the shape of the constellation. It is specifically defined as the relative reduction in the average signal power inherent in a signal constellation having a certain shape with respect to a cube having the same volume and dimensionality N as that constellation. In fact, a spherical signal constellation provides the theoretically maximum or full shape gain for each dimensionality N. Furthermore, the shape gain of a constellation can also be improved by increasing the dimensionality of the constellation, as taught by C. E. Shannon in his classic paper "Communication in the Presence of Noise," *Proc. IRE*, Vol. 37, January, 1949, pp. 10–21, which is hereby incorporated by reference. In fact, the shape gain of a spherical constellation approaches 1.53 dB as the dimensionality N becomes infinity. This shape gain is referred to as the "asymptotic shape gain."

In practice, the realization of the asymptotic shape gain is, nevertheless, thwarted by problems in realizing the circuitry for addressing the signal points of the signal constellation. For a given signaling rate, the number of required signal points grows exponentially with the dimensionality of the constellation. As a result, the complexity of the addressing circuitry increases tremendously and the speed thereof, accordingly, decreases. This being so, as the dimensionality becomes substantially large, such addressing circuitry invariably becomes too slow to support the given signaling rate.

Attempts have been made to solve the circuitry-complexity problem by simplifying the scheme for addressing the signal points. One such attempt for block coding uses an addressing technique as described in U.S. Pat. No. 4,507,648, issued Mar. 26, 1985 to Conway, et al., which is hereby incorporated by reference. Although this technique achieves a relatively simple addressing scheme, it unduly restricts a communications system to the use of a particular type of constellation which imposes an undesirably high PAR. Another attempt involves convolutional coding and uses a technique as proposed in U.S. Pat. No. 4,713,817, issued Dec. 15, 1987 to Wei, which is also hereby incorporated by reference. In accordance with this technique, an N-dimensional signal point is formed by concatenating a plurality of constituent 2-dimensional signal points in a prescribed manner, and each N-dimensional signal point is addressed in terms of these constituent 2-dimensional signal points. Significantly, the constellation resulting from using this technique provides a relatively low PAR, but, nevertheless, an undesirably small shape gain.

Accordingly, it is desirable to have a technique which not only provides a low PAR and a high shape gain, but can also efficiently address the signal points.

SUMMARY OF THE INVENTION

The present invention overcomes the prior art limitations by dividing a signal constellation into a plurality of regions. This signal constellation contains more signal points than normally needed for representing data to be transmitted. In accordance with the invention, the constellation is so divided that each one of the regions includes an equal number of signal points. The selection of the signal points from these regions is governed by a probability distribution so that signal points within any region are selected equiprobably, and the probability of selecting any signal point in one region is different from that in another region.

Advantageously, by choosing the probability distribution in a prescribed manner, the shape gain of the signal constellation is substantially increased while the PAR thereof is desirably decreased. More importantly, this shape gain can be made as close to the asymptotic shape gain as desired by increasing the number of regions. In addition, the above-described approach—dividing the constellation into regions and selecting signal points from those regions in accordance with the probability distribution—gives rise to an easy scheme for addressing the signal points which involves, for example, the use of a simple look-up table.

BRIEF DESCRIPTION OF THE DRAWING

In the drawing,

FIG. 2 is one of four identical 2-dimensional signal constellations constituting an 8-dimensional signal constellation, which is used to communicate data in accordance with the invention; and FIG. 3 is a block diagram of a data communications receiver which embodies the principles of the invention and which receives data from the transmitter of FIG. 1.

DETAILED DESCRIPTION

Figure 1:
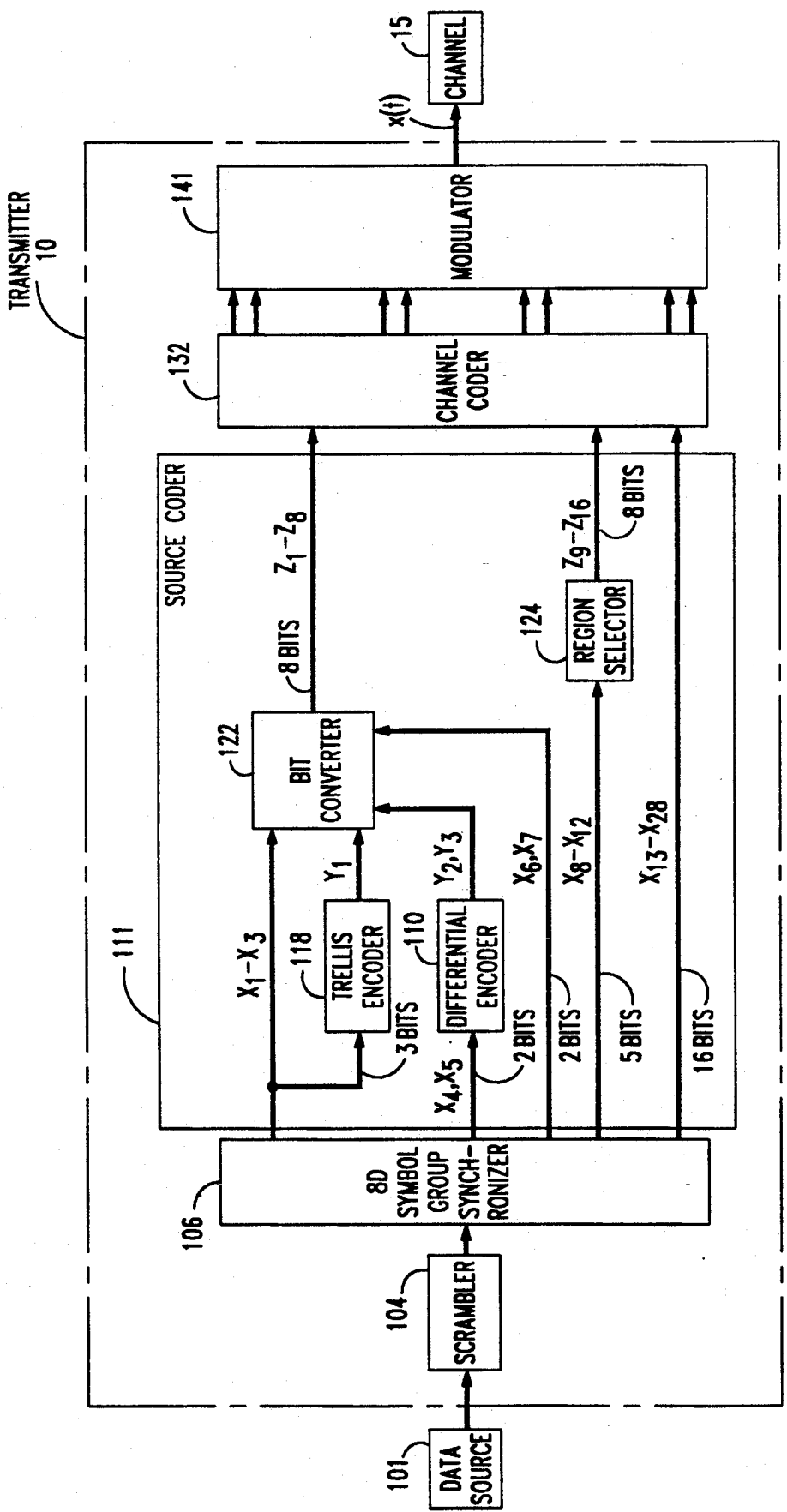
FIG. 1 is a block diagram of a data communications transmitter embodying the principles of the invention.

FIG. 1 illustrates transmitter 10 in a data communications system. Data bits to be transmitted are received by transmitter 10 from data source 101 and collected in groups of twenty-eight. Each group is then trellis-coded into an 8-dimensional (8D) channel symbol or signal point, which is selected from a predetermined 8-dimensional signal constellation in accordance with the principles of the present invention. Each 8-dimensional symbol is transmitted over communications channel 15 as four 2-dimensional double-sideband-quadrature-carrier (DSB-QC) pulses in the course of four successive baud intervals, each having a duration $T = 1/2742.8571$ sec. Thus, the data bits are communicated at a rate of $T/4 = 685.7142$ 8-dimensional symbols per second, thereby yielding a data transmission rate of 1.92 Kbps.

Specifically, scrambler 104 in transmitter 10 receives a stream of data bits from data source 101 which may be, for example, a digital computer. Scrambler 104, of conventional design, pseudo-randomizes the data bits to prevent concentrations of energy across the spectrum of the DSB-QC signal ultimately to be generated by modulator 141. 8D symbol group synchronizer 106 assembles the scrambled bits into twenty-eight-bit groups which are then applied to source coder 111 at the aforementioned symbol rate of 685.7142 symbols/sec. (In the general case, the group synchronizer assembles the scrambled bits into groups of pq/2 bits, where p is the dimensionality of the coding technique and q is the number of input bits coded in each 2-dimensional DSB-QC pulse baud interval. In this illustrative embodiment, $p=8$ and $q=7$.)

During each symbol interval, a twenty-eight-bit group including bits $X_1, X_2 \ldots$, and $X_{28}$ is received by source coder 111 wherein trellis encoder 118 takes in bits $X_1, X_2$ and $X_3$. Trellis encoder 118 is illustratively a systematic $\frac{3}{4}$, sixty-four-state encoder of conventional design. It introduces redundancy into the twenty-eight-bit group to allow the use of a maximum likelihood decoding technique at a receiver. This redundancy takes the form of an additional bit $Y_1$ which is generated by trellis encoder 118 in response to bits $X_1, X_2$ and $X_3$. The trellis code implemented by trellis encoder 118 uses this redundancy to provide the communications system with the so-called "coding gain" which manifests itself in the form of enhanced immunity to such random channel impairments as additive noise. Differential encoder 110 processes, in a standard way, bits $X_4$ and $X_5$ so as to allow the receiver to recover the transmitted symbol correctly, notwithstanding possible symbol constellation "rotations" as a result of phase hits in channel 15. The output of differential encoder 110, including bits $Y_2$ and $Y_3$, is applied to bit converter 122. Also applied to bit converter 122 are $X_6, X_7$, and the aforementioned bits $X_1, X_2, X_3$ and $Y_1$.

In this illustrative embodiment, as in trellis coding arrangements generally, the signal points of the signal constellation need to be partitioned into subsets. In fact, there are sixteen subsets in this embodiment. The bits $X_1, X_2, X_3$ and $Y_1$ identify the particular subset from which the signal point is ultimately selected by channel coder 132. As mentioned hereinbefore, each 8-dimensional channel symbol is transmitted over channel 15 as four 2-dimensional DSB-QC pulses. In particular, the generation of the 2-dimensional DSB-QC pulses is carried out using a set of 2-dimensional (2D) signal constellations. Each of these 2D constellations is used to identify a respective pair of pulse components which, in turn, are represented by a particular one of the 2-dimensional DSB-QC pulses. Since there are four such pairs of pulse components in each 8-dimensional symbol, four such 2D constellations are used. These four 2D constellations characterize the 8-dimensional signal constellation used in this embodiment and are commonly referred to as constituent 2D constellations. (The four constituent 2D constellations need not be all different from each other; indeed, they are identical in this particular illustrative embodiment.)

Refer now to FIG. 2 as well as FIG. 1. FIG. 2 shows one of the four identical constituent 2D constellations. This 2D constellation includes a plurality of 2-dimensional signal points, each associated with a particular one of a number of different possible 2-dimensional DSB-QC pulses. Thus, once four such signal points—one from each 2D constellation—have been identified, the entire ensemble of four 2-dimensional DSB-QC pulses representing an 8-dimensional symbol to be transmitted has been identified. The abscissa and the ordinate associated with each signal point in the 2D constellation respectively identify the in-phase (I) and the quadrature-phase (Q) amplitudes of the pair of pulse components to be represented by a particular 2-dimensional DSB-QC pulse.

The manner in which a particular 2-dimensional signal point is identified in a particular 2D constellation involves the division of the 2-dimensional signal points into partitions. In particular, the signal points are divided into four such partitions labeled A, B, C and D. As shown in FIG. 2, each of the sixteen central points is labeled to indicate to which partition it belongs. The assignment of the remaining 2-dimensional signal points to a particular partition follows the pattern shown.

Each of the aforementioned sixteen subsets of the 8-dimensional signal constellation is characterized by particular combinations of four 2-dimensional-signal-point partitions—one from each of the four constituent 2D constellations. These four constituent constellations, as noted above, are identical to one another in this embodiment. For example, one such set of combinations for a particular one of the sixteen subsets, namely subset 0, includes the following sixteen combinations:

| AAAA | CCCC | ABAB | CDCD |
| AABB | CCDD | ABBA | CDDC |
| BBAA | DDCC | BAAB | DCCD |
| BBBB | DDDD | BABA | DCDC |

Each of the other fifteen subsets similarly contains 8-dimensional symbols characterized by a respective set of sixteen combinations of the partitions.

The identification of a particular combination of four partitions associated with the identified subset is performed by bit converter 122. In particular, bit converter 122 processes bits $X_1$ through $X_3$, $Y_1$ through $Y_3$, $X_6$ and $X_7$ wherein bits $X_1, X_2, X_3$ and $Y_1$ are the subset-identifying bits, as noted before. The output word of bit converter 122 including bits $Z_1, Z_2, \ldots$ and $Z_8$ determines the particular combination of four 2-dimensional-signal-point partitions.

The manner in which a particular 2-dimensional signal point is identified in a particular 2D signal constellation further involves a coding scheme. This coding scheme is fully described hereinbelow. It suffices to know for now that such a coding scheme calls for a division of each constituent 2D constellation into different regions. As shown in FIG. 2, the constituent 2D constellation is divided into three regions. The first region occupies a center square of the 2D constellation and is defined by dash-dotted lines. This first region hereinafter is referred to as $\Omega_1$. The second region, defined by solid lines, includes four rectangular boxes each adjoining a side of the center square. This second region hereinafter is referred to as $\Omega_2$. The third region, denoted by dashed lines, includes eight outermost boxes, four of which are rectangular and the rest of which are square. This third region hereinafter is referred to as $\Omega_3$. In accordance with the present invention, each region contains an equal number of signal points. In this instance, there are sixty-four signal points in each region. The signal points within $\Omega_1, \Omega_2$ and $\Omega_3$ hereinafter are respectively referred to as $R_1$'s, $R_2$'s and $R_3$'s.

Referring now to FIG. 1, region selector 124 implements the aforementioned coding scheme and receives a 5-bit word, including bits $X_8$ through $X_{12}$, from 8D symbol group synchronizer 106 during each symbol interval. Region selector 124 processes the received five-bit words in pairs. Having received the five-bit word including bits $X_8$ through $X_{12}$, region selector 124 processes this word with the corresponding, immediately preceding five-bit word whose bits are designated as bits $X_8'$ through $X_{12}'$. These bits were stored in a buffer (not shown) during the immediately prior symbol interval. In response to this five-bit-word pair, region selector 124 generates a sixteen-bit region sequence including first and second subwords. Each of the first and second subwords has eight bits. The region sequence is indicative of the combination of 2D constellation regions from which eight 2-dimensional signal points are selected for the upcoming two symbol intervals. Specifically, the first subword of the region sequence, including bits $Z_9$ through $Z_{16}$, contains the region information for the ensemble of four 2-dimensional DSB-QC pulses to be transmitted for the current symbol interval, and the second subword, whose bits are designated as bits $Z_9'$ through $Z_{16}'$, contains the region information for the immediately succeeding symbol interval. This being so, region selector 124 outputs the first subword during the current symbol interval, and stores, in another buffer (not shown) for the time being, the second subword which is to be outputted during the immediately succeeding symbol interval.

The function of identifying a particular 2-dimensional signal point in each constituent 2D constellation is achieved by channel coder 132. Each 2-dimensional signal point, as shown in FIG. 2, is represented by two hexadecimal digits or eight bits. Thus, it takes thirty-two bits to identify an ensemble of four 2-dimensional signal points in the four respective constituent 2D constellations. Channel coder 132 identifies a particular such ensemble in response to these thirty-two bits including $X_{13}$ through $X_{28}$ from 8D symbol group synchronizer 106 and the aforementioned $Z_1$ through $Z_{16}$ bits which respectively contain the partition and region identification information. This being so, bits $X_{13}$ through $X_{28}$ identify the particular ensemble of signal points in the already-identified regions and partitions in the four respective 2D constellations.

Channel coder 132 maps the identified ensemble of four signal points into four corresponding pairs of in-phase and quadrature-phase amplitudes. It further generates four pairs of signals representing the respective amplitudes. For example, channel coder 132 generates signals representing in-phase and quadrature-phase amplitude pairs $(1, 1), (-1, 1), (-1, -1)$ and $(1, -1)$ corresponding to 2-dimensional signal points 00, 01, 02 and 03, respectively, in FIG. 2.

The output of channel coder 132 is applied to modulator 141. This modulator generates four two dimensional DSB-QC signals whose carriers have the in-phase and quadrature-phase amplitudes specified by coder 132. The DSB-QC signals, thus generated, after conventional spectral shaping, is applied to channel 15 as a signal x(t).

We now turn to a full description of the coding scheme used in this particular embodiment by referring to the following TABLE 1 and TABLE 2 simultaneously.

TABLE 1

| I | II | | | III | IV Input Sequences | | | | | | | | | |
|---|---|---|---|---|---|---|---|---|---|---|---|---|---|---|
| Class | $\Omega_1$ | $\Omega_2$ | $\Omega_3$ | # Allowed region combinations | $X_8'$ | $X_9'$ | $X_{10}'$ | $X_{11}'$ | $X_{12}'$ | $X_8$ | $X_9$ | $X_{10}$ | $X_{11}$ | $X_{12}$ |
| 1 | 8 | 0 | 0 | 1 | 0 | 0 | 0 | 0 | 0 | 0 | 0 | 0 | 0 | 0 |
| 2 | 7 | 1 | 0 | 8 | 0 | 0 | 0 | 0 | 0 | 0 | 0 | 0 | 0 | 1 |
|   |   |   |   |   | —0 | 0 | 0 | 0 | 0 | 0 | 0 | 1 | 0 | 0 |
| 3 | 7 | 0 | 1 | 8 | 0 | 0 | 0 | 0 | 0 | 0 | 0 | 1 | 0 | 1 |
|   |   |   |   |   | —0 | 0 | 0 | 0 | 0 | 1 | 0 | 0 | 0 | 0 |
| 4 | 6 | 2 | 0 | 28 | 0 | 0 | 0 | 0 | 0 | 0 | 1 | 0 | 0 | 1 |
|   |   |   |   |   | —0 | 0 | 0 | 0 | 1 | 0 | 1 | 1 | 0 | 0 |
| 5 | 6 | 1 | 1 | 56 | 0 | 0 | 0 | 0 | 1 | 0 | 1 | 1 | 0 | 1 |
|   |   |   |   |   | —0 | 0 | 0 | 1 | 1 | 0 | 0 | 1 | 0 | 0 |
| 6 | 6 | 0 | 2 | 28 | 0 | 0 | 0 | 1 | 1 | 0 | 0 | 1 | 0 | 1 |
|   |   |   |   |   | —0 | 0 | 1 | 0 | 0 | 0 | 0 | 0 | 0 | 0 |
| 7 | 5 | 3 | 0 | 56 | 0 | 0 | 1 | 0 | 0 | 0 | 0 | 0 | 0 | 1 |
|   |   |   |   |   | —0 | 0 | 1 | 0 | 1 | 1 | 1 | 0 | 0 | 0 |
| 8 | 5 | 2 | 1 | 168 | 0 | 0 | 1 | 0 | 1 | 1 | 1 | 0 | 0 | 1 |
|   |   |   |   |   | —0 | 1 | 0 | 1 | 1 | 0. | 0 | 0 | 0 | 0 |
| 9 | 5 | 1 | 2 | 168 | 0 | 1 | 0 | 1 | 1 | 0 | 0 | 0 | 0 | 1 |
|   |   |   |   |   | —1 | 0 | 0 | 0 | 0 | 0 | 1 | 0 | 0 | 0 |
| 10 | 5 | 0 | 3 | 56 | 1 | 0 | 0 | 0 | 0 | 0 | 1 | 0 | 0 | 1 |
|   |   |   |   |   | —1 | 0 | 0 | 1 | 0 | 0 | 0 | 0 | 0 | 0 |
| 11 | 4 | 4 | 0 | 70 | 1 | 0 | 0 | 1 | 0 | 0 | 0 | 0 | 0 | 1 |
|   |   |   |   |   | —1 | 0 | 1 | 0 | 0 | 0 | 0 | 1 | 1 | 0 |
| 12 | 4 | 3 | 1 | 280 | 1 | 0 | 1 | 0 | 0 | 0 | 0 | 1 | 1 | 1 |
|   |   |   |   |   | —1 | 1 | 1 | 0 | 0 | 1 | 1 | 1 | 1 | 0 |
| 13 | 4 | 2 | 2 | 97 | 1 | 1 | 1 | 0 | 0 | 1 | 1 | 1 | 1 | 1 |
|   |   |   |   |   | —1 | 1 | 1 | 1 | 1 | 1 | 1 | 1 | 1 | 1 |

TABLE 2

| I | II Exemplary Region Sequence | | | | | | | | III Exemplary Region Sequence in Binary | | | | | |
|---|---|---|---|---|---|---|---|---|---|---|---|---|---|---|
| Class | $S_1$ | $S_2$ | $S_3$ | $S_4$ | $S_1'$ | $S_2'$ | $S_3'$ | $S_4'$ | $Z_9$ | $Z_{10}$ | $Z_{11}$ | $Z_{12}$ | $Z_{13}$ | $Z_{14}$ |
| 1 | $R_1$ | $R_1$ | $R_1$ | $R_1$ | $R_1$ | $R_1$ | $R_1$ | $R_1$ | 0 | 0 | 0 | 0 | 0 | 0 |
| 2 | $R_1$ | $R_2$ | $R_1$ | $R_1$ | $R_1$ | $R_1$ | $R_1$ | $R_1$ | 0 | 0 | 0 | 1 | 0 | 0 |
| 3 | $R_1$ | $R_1$ | $R_3$ | $R_1$ | $R_1$ | $R_1$ | $R_1$ | $R_1$ | 0 | 0 | 0 | 0 | 1 | 0 |
| 4 | $R_1$ | $R_1$ | $R_2$ | $R_2$ | $R_1$ | $R_1$ | $R_1$ | $R_1$ | 0 | 0 | 0 | 0 | 0 | 1 |
| 5 | $R_1$ | $R_1$ | $R_3$ | $R_1$ | $R_2$ | $R_1$ | $R_1$ | $R_1$ | 0 | 0 | 0 | 0 | 1 | 0 |
| 6 | $R_3$ | $R_1$ | $R_3$ | $R_1$ | $R_1$ | $R_1$ | $R_1$ | $R_1$ | 1 | 0 | 0 | 0 | 1 | 0 |
| 7 | $R_1$ | $R_2$ | $R_2$ | $R_1$ | $R_1$ | $R_1$ | $R_1$ | $R_2$ | 0 | 0 | 0 | 1 | 0 | 1 |
| 8 | $R_2$ | $R_1$ | $R_3$ | $R_2$ | $R_1$ | $R_1$ | $R_1$ | $R_1$ | 0 | 1 | 0 | 0 | 1 | 0 |
| 9 | $R_1$ | $R_2$ | $R_3$ | $R_1$ | $R_3$ | $R_1$ | $R_1$ | $R_1$ | 0 | 0 | 0 | 1 | 1 | 0 |
| 10 | $R_1$ | $R_1$ | $R_3$ | $R_3$ | $R_1$ | $R_3$ | $R_1$ | $R_1$ | 0 | 0 | 0 | 0 | 1 | 0 |
| 11 | $R_1$ | $R_2$ | $R_2$ | $R_1$ | $R_2$ | $R_2$ | $R_1$ | $R_1$ | 0 | 0 | 0 | 1 | 0 | 1 |
| 12 | $R_1$ | $R_2$ | $R_3$ | $R_2$ | $R_2$ | $R_1$ | $R_1$ | $R_1$ | 0 | 0 | 0 | 1 | 1 | 0 |
| 13 | $R_1$ | $R_2$ | $R_3$ | $R_1$ | $R_3$ | $R_2$ | $R_1$ | $R_1$ | 0 | 0 | 0 | 1 | 1 | 0 |

| I | III Exemplary Region Sequence in Binary | | | | | | | | |
|---|---|---|---|---|---|---|---|---|---|
| Class | $Z_{15}$ | $Z_{16}$ | $Z_9'$ | $Z_{10}'$ | $Z_{11}'$ | $Z_{12}'$ | $Z_{13}'$ | $Z_{14}'$ | $Z_{15}'$ | $Z_{16}'$ |
| 1 | 0 | 0 | 0 | 0 | 0 | 0 | 0 | 0 | 0 | 0 |
| 2 | 0 | 0 | 0 | 0 | 0 | 0 | 0 | 0 | 0 | 0 |
| 3 | 0 | 0 | 0 | 0 | 0 | 0 | 0 | 0 | 0 | 0 |
| 4 | 0 | 1 | 0 | 0 | 0 | 0 | 0 | 0 | 0 | 0 |
| 5 | 0 | 0 | 0 | 1 | 0 | 0 | 0 | 0 | 0 | 0 |
| 6 | 0 | 0 | 0 | 0 | 0 | 0 | 0 | 0 | 0 | 0 |
| 7 | 0 | 0 | 0 | 0 | 0 | 0 | 0 | 0 | 0 | 1 |
| 8 | 0 | 1 | 0 | 0 | 0 | 0 | 0 | 0 | 0 | 0 |
| 9 | 0 | 0 | 1 | 0 | 0 | 0 | 0 | 0 | 0 | 0 |
| 10 | 1 | 0 | 0 | 0 | 1 | 0 | 0 | 0 | 0 | 0 |
| 11 | 0 | 0 | 0 | 1 | 0 | 1 | 0 | 0 | 0 | 0 |
| 12 | 0 | 1 | 0 | 1 | 0 | 0 | 0 | 0 | 0 | 0 |
| 13 | 0 | 0 | 1 | 0 | 0 | 1 | 0 | 0 | 0 | 0 |

This coding scheme requires that each of eight successive 2-dimensional signal points be selected from one of the regions—$\Omega_1, \Omega_2$ and $\Omega_3$—of the respective constituent 2D constellation in a prescribed manner. As shown in TABLE 2, these eight successive 2-dimensional signal points are denoted $S_1, S_2, S_3, S_4, S_1', S_2', S_3'$ and $S_4'$ and are taken from the four respective constituent 2D constellations over a period of two symbol intervals. (The subscripts 1, 2, 3 and 4 are used to indicate that the signal points are selected from different ones of the four respective constituent 2D constellations.) Specifically, the combination of $S_1, S_2, S_3$ and $S_4$ are selected during a first symbol interval and the combination of $S_1', S_2', S_3'$ and $S_4'$ are selected during the immediately succeeding symbol interval.

Referring to TABLE 1, column I indicates that there are thirteen classes of combinations of regions from which the eight successive signal points may be selected in accordance with the coding scheme. Specifically, in class 1, all of these eight successive signal points are required, as indicated in column II, to be selected from $\Omega_1$. Column III shows that this requirement yields only one possible combination of regions. Specifically, in response to an input sequence of $(X_8'X_9'X_{10}'X_{11}'X_{12}'X_8X_9X_{10}X_{11}X_{12}) = (0000000000)$ as indicated in column IV, region selector 124, which implements the present coding scheme, outputs a region sequence indicative of that one combination within class 1. The composition of a region sequence is described in further detail hereinbelow. It should be noted at this point that for each different input sequence, a region sequence is assigned thereto in a predetermined manner. In class 2, any seven of the eight successive signal points are required to be selected from $\Omega_1$ and the remaining one from $\Omega_2$, thereby yielding eight possible combinations of regions. Specifically, in response to one of the eight input sequences of (0000000001) through (0000000100), region selector 124 outputs a region sequence indicative of one of these eight possible combinations of regions within class 2. Similarly, classes 3 through 12 are each realized based on particular selections of the signal points from $\Omega_1, \Omega_2$ and $\Omega_3$, as set forth in TABLE 1. Stemming from the limited number of the input sequences which is $2^{10} = 1024$, only ninety-seven region combinations are needed for class 13 to arrive at the corresponding total of 1024 region combinations in classes 1 through 13. These ninety-seven combinations are arbitrarily chosen from the 420 possible region combinations each satisfying the requirement that four of the eight successive signal points be selected from $\Omega_1$, two from $\Omega_2$ and the remaining two from $\Omega_3$.

TABLE 2 shows an exemplary region sequence allowable in each of classes 1 through 13. For example, in class 8, as shown in TABLE 1, wherein any five out of the eight successive signal points are required to be selected from $\Omega_1$, two from $\Omega_2$, and one from $\Omega_3$, an exemplary region sequence, as shown in TABLE 2, column II, is that $(S_1 S_2 S_3 S_4 S_1' S_2' S_3' S_4') = (R_2 R_1 R_3 R_2 R_1 R_1 R_1 R_1)$. That is, each of these signal points is selected from $\Omega_1$, except for $S_1$ and $S_4$ which are from $\Omega_2$, and $S_3$ which is from $\Omega_3$. (It is noteworthy that 167 other exemplary region sequences, although not shown here, each satisfy the class 8 region selection requirement. Because these other region sequences are apparent to a person skilled in the art based on the disclosure heretofore, their specific combinations need not be dwelled upon here.) Region selector 124 outputs a region sequence in binary bits representing the region information for each of the eight successive signal points. In this illustrative embodiment, the binary bits of a region sequence are arranged in pairs, and the bit-pairs are assigned in such a manner that $Z_9$ and $Z_{10}$ represent the region information for $S_1$, $Z_{11}$ and $Z_{12}$ for $S_2$, $Z_{13}$ and $Z_{14}$ for $S_3$, $Z_{15}$ and $Z_{16}$ for $S_4$, $Z_9'$ and $Z_{10}'$ for $S_1'$, $Z_{11}'$ and $Z_{12}'$ for $S_2'$, $Z_{Z13}'$ and $Z_{14}'$ for $S_3'$, and $Z_{15}'$ and $Z_{16}'$ for $S_4'$. A bit-pair is assigned a binary value 00 if the associated signal point is an $R_1$, a value 01 if the signal point is an $R_2$, and a value 10 if it is an $R_3$. Thus continuing with the above class 8 example, the corresponding region sequence outputted by region selector 124 is $(Z_9'Z_{10}'Z_{11}Z_{12}Z_{13}Z_{14}Z_{15}Z_{16}Z_9'Z_{10}'Z_{11}'Z_{12}'Z_{13}'Z_{14}'Z_{15}'Z_{16}') = (0100100100000000)$ as shown in column III. Indeed, this binary sequence indicates that $S_1$ and $S_4$ are $R_2$'s since their respective bit-pairs ($Z_9Z_{10}$) and ($Z_{15}Z_{16}$) are each equal to (01); $S_3$ is an $R_3$ since ($Z_{13}Z_{14}$) is equal to (10); and the remaining signal points are all $R_1$'s since their respective bit-pairs are each equal to (00). Similarly, region sequences within other classes are formed based on the same principles.

It can be shown that stemming from the use of the above-described coding scheme, the present constellation achieves a shape gain of 0.58 dB. (It can also be shown that this shape gain can be improved by increasing the number of regions. In fact, it can virtually reach the asymptotic shape gain—1.53 dB—when the number of regions is chosen large enough.) A PAR of 2.77 is also achieved by using the present coding scheme in conjunction with the constellation. This combination of shape gain and PAR is superior relative to the combinations achievable by prior art signaling schemes. This superiority is attributed to the present inventive concept which broadly encompasses the division of a signal constellation into a plurality of regions, each of which encloses an equal number of signal points. This inventive concept further includes the control of the selection of the signal points in accordance with a probability distribution via the design of a coding scheme so that signal points within any one region are equiprobably selected for transmission. On the other hand, the probability of selecting any signal point in one region is different from that in another region. In accordance with the present invention, the probability distribution is so chosen that signal points requiring relatively low transmission power are transmitted more often, thereby keeping the average signal power of the constellation desirably low. It can be shown that in this particular illustrative embodiment, the probability distribution resulting from the use of the above-described coding scheme is such that the probabilities of selecting an $R_1$ (i.e., a signal point from $\Omega_1$), an $R_2$ (i.e., a signal point from $\Omega_2$) and an $R_3$ (i.e., a signal point from $\Omega_3$) are, respectively, 1205/2048, 1053/4096 and 633/4096.

It should be pointed out at this juncture that in accordance with the present invention, a desirable combination of shape gain and PAR can also be achieved by dividing the present 8-dimensional constellation into a plurality of 8-dimensional regions and controlling the selection of the 8-dimensional signal points from those regions according to a probability distribution. However, it can be shown that this approach is more complicated to implement than the approach which involves the division of each of the constituent 2D constellations into regions, as discussed heretofore. This is due to the fact that the latter approach can be easily implemented using a simple look-up table.

The aforementioned signal x(t) is corrupted in channel 15 by such impairments as Gaussian noise, phase jitter, frequency offset and intersymbol interference. As shown in FIG. 3, receiver 30 receives a signal x'(t) associated with x(t). In a well known manner, this signal x'(t) is applied within receiver 30 to analog interface 307 which includes an antialiasing filter and automatic gain control (AGC) circuit. The resulting signal is then applied to A/D converter 309 which provides the digital samples of its input. These digital samples are applied to bandpass filter/phase splitter 314. The latter generates a digital bandpass-filtered version of the digital samples and the Hilbert transform of the same on cables 315 and 316, respectively. These cables extend to the input of equalizer/demodulator 331. For each baud interval, equalizer/demodulator 331 provides a pair of equalized baseband outputs which respectively represent the values of the in-phase and quadrature-phase components of the received 2-dimensional carrier pulse currently being processed. Because, for example, the equalizer cannot perfectly compensate for all channel impairments, the values are not, in general, whole integers. Therefore, it remains to be determined from the outputs of equalizer/demodulator 331 what the most likely transmitted values were.

To this end, 8D symbol group synchronizer 330 collects four pairs of the equalizer/demodulator outputs to form individual 8-dimensional symbol groups. The output of 8D symbol group synchronizer 330 feeds Viterbi decoder 334 which, in a conventional fashion, determines and outputs the most likely sequence of 8-dimensional symbol values from all of the allowed possibilities. Channel decoder 345 performs the inverse function to that provided by channel coder 132 of FIG. 1. Specifically, decoder 345 recovers the thirty-two-bit digital word corresponding to the set of four in-phase and quadrature-phase amplitudes of pulse components associated with the 8-dimensional symbol just determined by Viterbi decoder 334. It then eliminates one bit, which corresponds to the redundancy bit Y1 of FIG. 1, from the recovered word and passes the remaining thirty-one bits to source decoder 350. Similarly, source decoder 350 performs the inverse function to that provided by source coder 111 of FIG. 1. To this end, the thirty-one bits received by source decoder 350 are respectively distributed among bit deconverter 354, region decoder 359 and descrambler 362 in an apportionment of seven bits, eight bits and sixteen bits. Five of the seven deconverted bits from bit deconverter 354 are applied to descrambler 362 while the remaining two deconverted bits are further decoded by differential decoder 358 before they are applied to descrambler 362. Region decoder 359, performing the inverse function to that provided by region selector 124 of FIG. 1, supplies five additional bits to descrambler 362. As a result, descrambler 362 receives twenty-eight bits in total for it to descramble. The descrambled bits are thereupon sent to data sink 371 which may be, for example, a computer terminal.

The foregoing merely illustrates the principles of the invention. It will thus be appreciated that those skilled in the art will be able to devise numerous arrangements which although not explicity shown or described herein, embody the principles of the invention and are within its spirit and scope.

For example, some variations of particular embodiments of the present invention include selection of different, and a different number of, symbols, including different in-phase and quadrature-phase component values, to carry data. Moreover, the invention is applicable to virtually any type of constellation geometry, including constellations which are other than rectilinear (e.g. circular), constellations whose data symbols have more than two dimensions. In addition, the invention can be used equally well in block, convolutional or other types of coding applications as well as with various types of modulation including, for example, QAM, phase shift keying, etc.

Each of the various possible approaches will have its own set of advantages and disadvantages, as will be apparent from the foregoing discussion, and the particular embodiment of the invention used for a particular application should, of course, be chosen based on the requirements and characteristics of that application.

We claim:

1. Data transmission apparatus comprising
    means for selecting signal points in a signal constellation in response to incoming data, said signal constellation including a plurality of regions with each region having an identical number of signal points, said selecting means carrying out said selecting in accordance with a predetermined signal point probability distribution in which the selection of signal points within any one region is equally probable and the probability of selecting any signal point in one region is different from that in another region, and
    means for transmitting a signal representative of the selected signal points.

2. The apparatus of claim 1 wherein said selecting means further includes means for mapping a first number of bits in said incoming data into a second number of bits, said second number being greater than said first number.

3. The apparatus of claim 2 wherein a predetermined subset of said second number of bits determines said predetermined probability distribution.

4. The apparatus of claim 1 wherein said signal constellation is multidimensional.

5. The apparatus of claim 1 wherein said incoming data is encoded with a trellis code.

6. The apparatus of claim 1 wherein said predetermined probability distribution is designed so as to decrease a peak-to-average-power ratio (PAR) and increase a shape gain associated with said signal constellation.

7. Apparatus for transmitting a plurality of signal points in a signal constellation, each of said plurality of signal points representing incoming data, said apparatus comprising
    means for defining a plurality of regions within said constellation, each one of said regions including an identical number of signal points, and
    means for assigning a plurality of probabilistic values to said regions so that each one of said regions is assigned a different one of said probabilistic values, and for selecting signal points in any particular one of said regions with a probability equal to the probabilistic value assigned to that particular region.

8. The apparatus of claim 7 wherein said apparatus further includes means for mapping a first number of bits in said incoming data into a second number of bits, said second number being greater than said first number.

9. The apparatus of claim 7 wherein said signal constellation is multidimensional.

10. The apparatus of claim 7 wherein said incoming data is encoded with a trellis code.

11. The apparatus of claim 7 wherein said plurality of probabilistic values are so determined as to decrease a PAR and increase a shape gain associated with said signal constellation.

12. A communications system using a signal constellation, which includes a plurality of signal points, to communicate data, said communications system comprising
    means for selecting ones of said signal points in said signal constellation for transmission, said signal constellation including a plurality of regions with each region having an identical number of signal points, said selecting means carrying out said selecting in accordance with a predetermined signal point probability distribution in which the selection of signal points within any one region is equally probable and the probability of selecting any signal point in one region is different from that in another region,
    means for transmitting a signal representing the selected signal points, and
    means responsive to said signal for recovering said selected signal points.

13. The system of claim 12 wherein said selecting means further includes means for mapping a first number of bits in said data into a second number of bits, said second number being greater than said first number.

14. The system of claim 13 wherein a predetermined subset of said second number of bits determines said predetermined probability distribution.

15. The system of claim 12 wherein said signal constellation is multidimensional.

16. The system of claim 12 wherein said data is encoded with a trellis code.

17. The system of claim 12 wherein said predetermined probability distribution is designed so as to decrease a PAR and increase a shape gain associated with said signal constellation.

18. A method for transmitting data, said method comprising the steps of
    selecting signal points in a signal constellation in response to incoming data, said signal constellation including a plurality of regions with each region having an identical number of signal points, said selecting means carrying out said selecting in accordance with a predetermined signal point probability distribution in which the selection of signal points within any one region is equally probable and the probability of selecting any signal point in one region is different from that in another region, and
    transmitting a signal representative of the selected signal points.

19. The method of claim 18 wherein said selecting step further includes the step of mapping a first number of bits in said incoming data into a second number of bits, said second number being greater than said first number.

20. The method of claim 19 wherein a predetermined subset of said second number of bits determines said predetermined probability distribution.

21. The method of claim 18 wherein said signal constellation is multidimensional.

22. The method of claim 18 wherein said incoming data is encoded with a trellis code.

23. The method of claim 18 wherein said predetermined probability distribution is designed so as to decrease a PAR and a shape gain associated with said signal constellation.

24. A method for transmitting a plurality of signal points in a signal constellation, each of said plurality of signal points representing incoming data, said method comprising the steps of defining a plurality of regions within said constellation, each one of said regions including an identical number of signal points, assigning a plurality of probabilistic values to said regions so that each one of said regions is assigned a different one of said probabilistic values, and selecting signal points from any particular one of said regions with a probability equal to the probabilistic value assigned to that particular region.

25. The method of claim 24 wherein said method further includes the step of mapping a first number of bits in said incoming data into a second number of bits, said second number being greater than said first number.

26. The method of claim 24 wherein said signal constellation is multidimensional.

27. The method of claim 24 wherein said incoming data is encoded with a trellis code.

28. The method of claim 27 wherein said plurality of probabilistic values are so determined as to decrease a PAR and a shape gain associated with said signal constellation.

29. A method for use in a communications system employing a signal constellation to communicate data, said signal constellation includes a plurality of signal points, said method comprising the steps of selecting ones of said signal points in said signal constellation for transmission, said signal constellation including a plurality of regions with each region having an identical number of signal points, said selecting step carrying out said selecting in accordance with a predetermined signal point probability distribution in which the selection of signal points within any one region is equally probable and the probability of selecting any signal point in one region is different from that in another region, transmitting a signal representing the selected signal points, and recovering said selected signal points in response to said signal.

30. The method of claim 29 wherein said selecting step further includes the step of mapping a first number of bits in said data into a second number of bits, said second number being greater than said first number.

31. The method of claim 30 wherein a predetermined subset of said second number of bits determines said predetermined probability distribution.

32. The method of claim 29 wherein said signal constellation is multidimensional.

33. The method of claim 29 wherein said data is encoded with a trellis code.

34. The method of claim 29 wherein said predetermined probability distribution is designed so as to decrease a PAR and increase a shape gain associated with said signal constellation.

* * * * *